United States Patent [19]

Hidaka

[11] Patent Number: 5,039,656
[45] Date of Patent: Aug. 13, 1991

[54] SUPERCONDUCTOR MAGNETIC MEMORY USING MAGNETIC FILMS

[76] Inventor: Yasuharu Hidaka, c/o NEC Corporation, 33-1, Shiba 5-chome, Minato-ku, Tokyo, Japan

[21] Appl. No.: 316,699

[22] Filed: Feb. 28, 1989

[30] Foreign Application Priority Data

Feb. 29, 1988 [JP] Japan .................................. 63-47724
May 13, 1988 [JP] Japan .................................. 63-116601
Aug. 10, 1988 [JP] Japan .................................. 63-200523

[51] Int. Cl.$^5$ .......................................... G11C 11/44
[52] U.S. Cl. ....................................... 505/1; 365/162; 365/161; 365/160; 505/700; 505/704; 505/832; 505/833; 357/5
[58] Field of Search ...................... 365/160, 161, 162; 505/700, 701, 702, 704, 831–837, 838, 861–862; 357/5

[56] References Cited

U.S. PATENT DOCUMENTS

| | | | |
|---|---|---|---|
| 3,441,915 | 4/1969 | Hug | 365/161 |
| 3,626,391 | 12/1971 | Anacker | 505/832 |
| 4,494,131 | 1/1985 | Ohta | 357/5 |
| 4,660,061 | 4/1987 | Sweeny et al. | 357/5 X |

FOREIGN PATENT DOCUMENTS

| | | | |
|---|---|---|---|
| 58-143495 | 8/1983 | Japan | 505/832 |
| 61-175996 | 8/1986 | Japan | 505/832 |

OTHER PUBLICATIONS

IEEE Transactions on Magnetics, vol. MAG-15, No. 1, Jan. 79, "All-Refractory Weak-Link" by D. W. Jillie et al., pp. 486–487.
IBM Technical Disclosure Bulletin, vol. 20, No. 7, Dec. 77, pp. 2839–2840, "Josephson Memory Cell with Mag. Film" by Broom et al.
Electronic Products Jan. 11, 84, pp. 17–18, Outlook "Superconductive Logic Survives IBM Bailout" by Fans.
"Alumite Disc Using Anodic Oxidation", T. Tsuya et al., J. Magnetics Society of Japan (in Japanese), vol. 11, No. 2, 1987.

Primary Examiner—Joseph A. Popek
Assistant Examiner—Alfonso Garcia

[57] ABSTRACT

This invention relates to a magnetic memory including a first superconductor wire, a second superconductor wire disposed in such a manner as to cross the first superconductor wire substantially orthogonally, a first magnetic film disposed at the point of intersection between the first and second superconductor wires and a second magnetic film interposed between the first magnetic film and the first or second superconductor films, wherein at least one of the uniaxial magnetic anisotropy within the plane of the films and coercive force of the first and second magnetic films is mutually different. Furthermore, a superconductor film containing a large number of microscopic Josephson junctions is disposed between the first and second magnetic films or on the other side of the superconductor wire connected to the magnetic film, and a lead wire for applying a current is connected to the superconductor film.

5 Claims, 6 Drawing Sheets

SUPERCONDUCTOR MAGNETIC MEMORY USING MAGNETIC FILMS

BACKGROUND OF THE INVENTION

This invention relates to a non-volatile, high-density, solid magnetic memory, and more particularly to a magnetic memory using superconductor.

Solid magnetic memories can be classified broadly into a random access type and a serial access type. A core memory is a typical example of the former and a bubble memory, a typical example of the latter. To accomplish a high-density memory, the random access type involves the drawback that there is a limit to miniaturization of a cell size because a sensor is necessary for each bit. Though the serial access type can accomplish a high storage density relatively easily, it is not free from the critical problem in that the access time increases with an increasing storage density. Furthermore, those memory devices such as a bubble memory which require movement of bubbles as an information carrier have the drawback that stability of information is deteriorated with the movement. Under these circumstances it is desirable to develop a sensor for the random access memory and to accomplish its high storage density as a non-volatile solid magnetic memory.

The drawback with the core memory as the typical example of the random access memory using a magnetic material has lain in that the cell size is large and high storage density cannot be accomplished easily.

To accomplish a high storage density, a magnetic memory using a magnetic thin film has been proposed. The magnetic thin film is, for example, a 19% Fe-81% Ni alloy as a soft magnetic material having a magnetostriction constant $\lambda=0$ and is vacuum deposited in a disk-like form at the point of intersections of conductor wires disposed in both longitudinal and transverse directions. However, this memory involves the problems that stability of stored information is not high because magnetization of the disc-like magnetic film returns gradually to original directions due to the interaction with the adjacent cells and when the magnetic pattern is minituarized, the detection output becomes small and information read-out becomes difficult.

In order to solve these problems, the inventor of the present invention proposed already (not published) a high-density solid magnetic memory in my copending U.S. patent application Ser. No. 07/302,673, now an allowed application. In this magnetic memory, a ring structure made of a superconductor material is introduced, stability of stored information is improved by utilizing a diamagnetic current occurring in this superconductor ring and read-out of stored information is made easier by utilizing the transition between superconduction state and normal state of the superconductor ring. Its basic structure is as follows. In a magnetic memory including a ferromagnetic film having uniaxial magnetic anisotropy within the plane of a film on a substrate and first and second superconductor wires disposed in such a manner as to cross each other to sandwich the magnetic film at a cross-over area of the two wires, the present invention disposes a third superconductor wire in such a manner as to be overlaid on the first superconductor wire and to encompass the magnetic film pattern and the second superconductor wire and disposes further another conductor wire or superconductor wire in such a manner as to be overlaid on the superconductor wires at positions where the first and third superconductor wires cross the second superconductor wire.

In this memory, the ring formed by the first and third superconductor wires must once be switched to the normal state at the end of the magnetization reversal process (the information write process for each cell) in order to reverse the magnetization of the magnetic pattern inside the ring formed by the first and third superconductor wires. The transition between the superconductor state and the normal state is generally attained by applying a current above a critical current to the superconductors forming the ring, but when this method is employed, the critical currents for the first and third superconductors must be reduced as much as possible in order to keep power consumption of the memory at a low level. If the critical current is reduced, on the other hand, the force for confirming the magnetic flux inside the ring becomes weak and there takes place the limit to miniaturization of the cell size that is the greatest target. Since the difference is provided in the critical currents of the first and third superconductors in order to read out information, the critical currents of the superconductors must be controlled accurately. However, the superconductors that can be utilized are generally two kinds, and the phenomenon that the magnetic flux leaving the magnetic pattern is trapped by the superconductor ring makes the problem all the more complicated. Thus, the superconductor ring involves the serious drawback irrespective of its merit.

SUMMARY OF THE INVENTION

It is an object of the present invention to provide a high-density, solid magnetic memory which simplifies the memory structure, improves operation stability and reduces power consumption.

In accordance with the present invention, the role played by the superconductor ring is replaced by the structure comprising the combination of a film pattern with high coercive force and a film pattern with low coercive force, or a magnetic film pattern having large uniaxial magnetic anisotropy within the plane of film and a magnetic film pattern having small uniaxial magnetic anisotropy (inclusive of magnetic films not having magnetic anisotropy) and a superconductor pattern containing a large number of microscopic Josephson junctions to simplify the memory structure, and there can thus be obtained a high-density, solid magnetic memory having high operation stability and reduced power consumption.

In accordance with a preferred embodiment of the present invention, there can be obtained a magnetic memory characterized in that a three-layered structural film consisting of two magnetic films at least one of uniaxial magnetic anisotropy and coercive force of which is mutually different and a superconductor film is patterned, first and second superconductor wires crossing each other at the pattern position are disposed above and below the patterned film and lead wires for applying a current are connected to the superconductor film pattern in the three-layered structural pattern.

In accordance with another preferred embodiment of the present invention, there is provided a high-density, solid magnetic memory having improved operation stability and reduced operation time by improving the memory structure wherein a three-layered structure consisting of two magnetic films at least one of uniaxial magnetic anisotropy and coercive force of which is mutually different and a superconductor film is patterned, first and second superconductor wires crossing each other at the pattern position are disposed above and below the patterned film and lead wires for applying a current to the three-layered structure pattern is fitted. Namely, first and second superconductor wires are disposed above and below a three-layered structural pattern consisting of first and second two magnetic film patterns at least one of uniaxial magnetic anisotropy inside the plane of film and coercive force of which is mutually different, and are sandwiched between superconductor layers in such a manner as to cross each other at the position of the three-layered structural pattern and a superconductor pattern for a sensor at the time of read-out is disposed outside the superconductor wire (on the side opposite to the side where the magnetic film pattern exists). The structure wherein the lead wires for applying a current are connected to the superconductor film pattern and the superconductor film is formed outside the lead wires through an insulator is thus replaced, and there is provided a high-density, solid magnetic memory having improved operation stability and reduced operation time. The present invention provides also a method of fabricating the high-density, solid magnetic memory, which method comprises forming pores on an aluminum thin film vapor-deposited in advance in a pattern formation region by anodic oxidation as the superconductor pattern for the sensor, and packing a superconductor into pores to form a pattern consisting of a large number of very small Josephson junctions.

DESCRIPTION OF THE PREFERRED EMBODIMENTS

Embodiment 1

Figure 1:
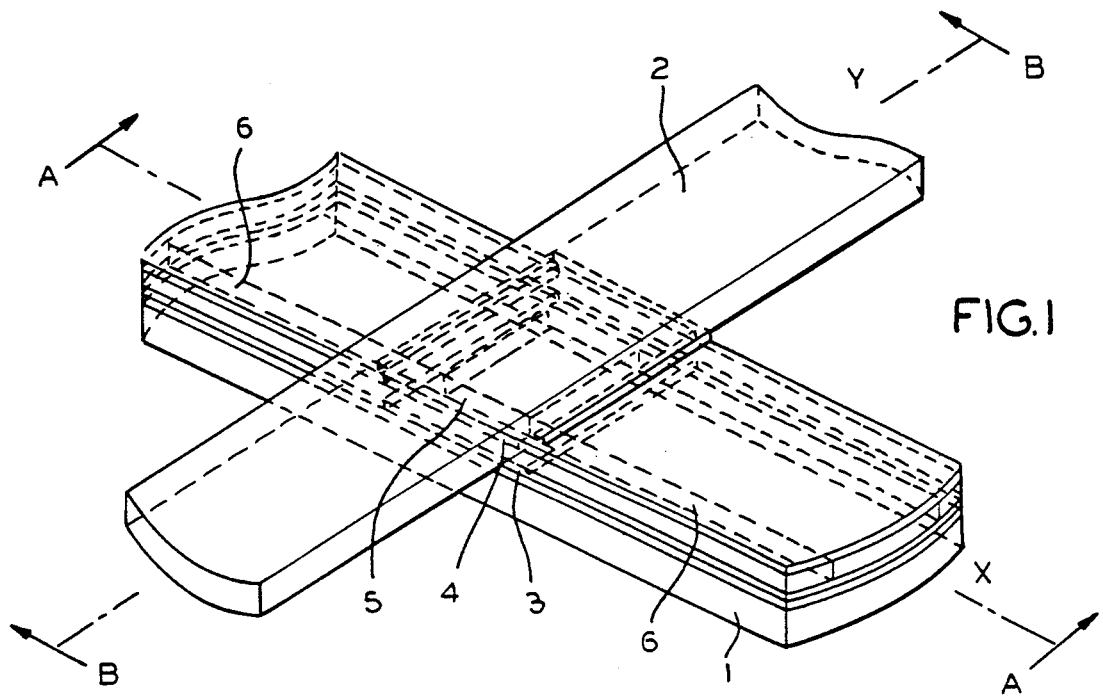
FIG. 1 is a schematic perspective view showing the structural example of a basic cell in accordance with a first or second embodiment of the present invention.
Figure 2A:
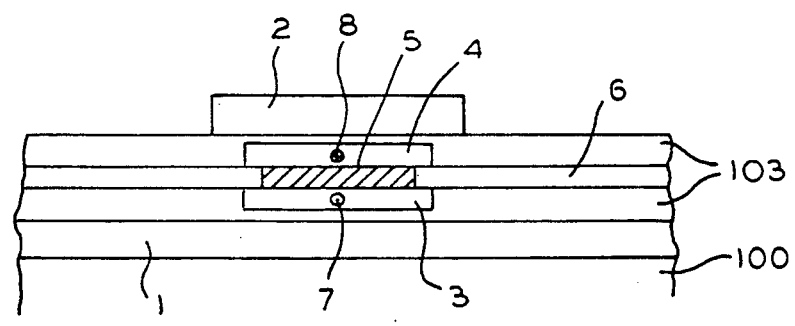
FIG. 2A is a sectional view taken along line A—A of FIG. 1.
Figure 2B:
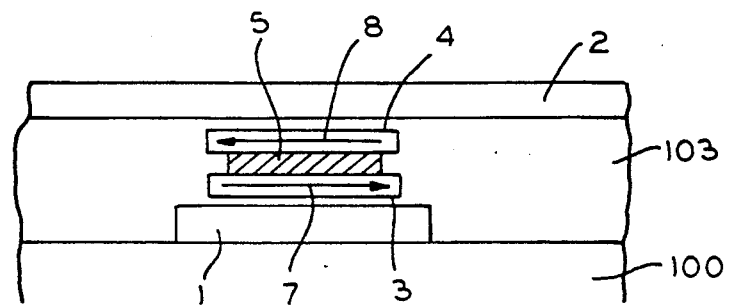
FIG. 2B is a sectional view taken along line B—B of FIG. 1.

Referring to FIGS. 1, 2A and 2B, a superconductor layer is formed on a substrate 100 and is patterned to form a first superconductor wire 1 extending in an X-axis direction. A pattern 3 formed by a ferromagnetic film with low coercive force (coercive force < 1 Oe) is disposed on the first superconductor wire 1 with an insulator layer 103 interposed therebetween. A superconductor film pattern 5 and its lead wire 6 are disposed on the pattern 3 and a pattern 4 formed by a ferromagnetic film with high coercive force (coercive force ~ 1 Oe) is disposed on the former. Furthermore, a second superconductor wire 2 is disposed on the pattern 4 with the insulator layer 103 interposed therebetween and extending in a Y-axis direction so as to cross the first superconductor wire 1. Reference numeral 6 represents a conductor (or superconductor) wire for applying a current to the superconductor pattern 5.

Figure 3:
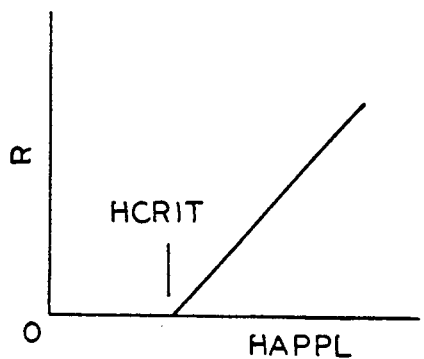
FIG. 3 is a characteristic diagram showing the relation between electric resistance of a superconductor thin film for a pattern 5 in FIG. 1 and a magnetic field applied from outside.

Since this embodiment uses a composite film pattern consisting of the ferromagnetic film with high coercive force, the superconductor film and the ferromagnetic film with low coercive force, the embodiment is characterized in that the problems encountered when the superconductor ring is employed are eliminated. In this memory, information is written into and stored in the ferromagnetic film pattern 4 with high coercive force in the three-layered structural pattern consisting of the ferromagnetic film pattern with high coercive force, the superconductor film pattern and the ferromagnetic film pattern with low coercive force. The ferromagnetic film pattern with low coercive force is used for read-out of the written information and for holding stably the written information. The superconductor film pattern 5 used hereby has the structure containing a large number of later-appearing Josephson junctions and has the property such that when a critical magnetic field $H_{crit}$ is applied, superconduction at the junction is easily broken and turns to normal state. FIG. 3 shows the relation between the electric resistance R of the superconductor thin film that can be used for the pattern 5 and the magnetic field $H_{appl}$ applied from outside. The electric resistance appears when $H_{appl}$ is larger than $H_{crit}$.

Figure 4A:
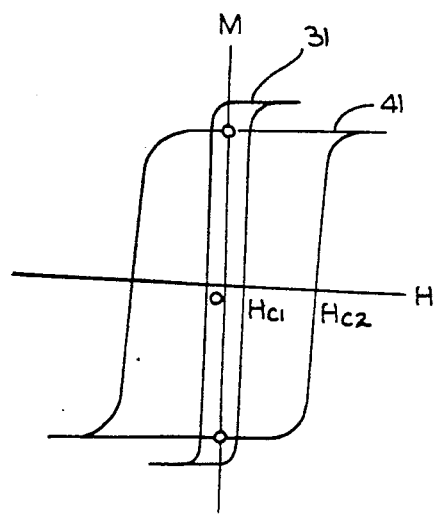
FIG. 4A is a characteristic diagram showing a magnetization curve of the coherent magnetization reversal mode of a ferromagnetic film with low coercive force $H_{C1}$ and a ferromagnetic film with high coercive force $H_{C2}$.
Figure 5:
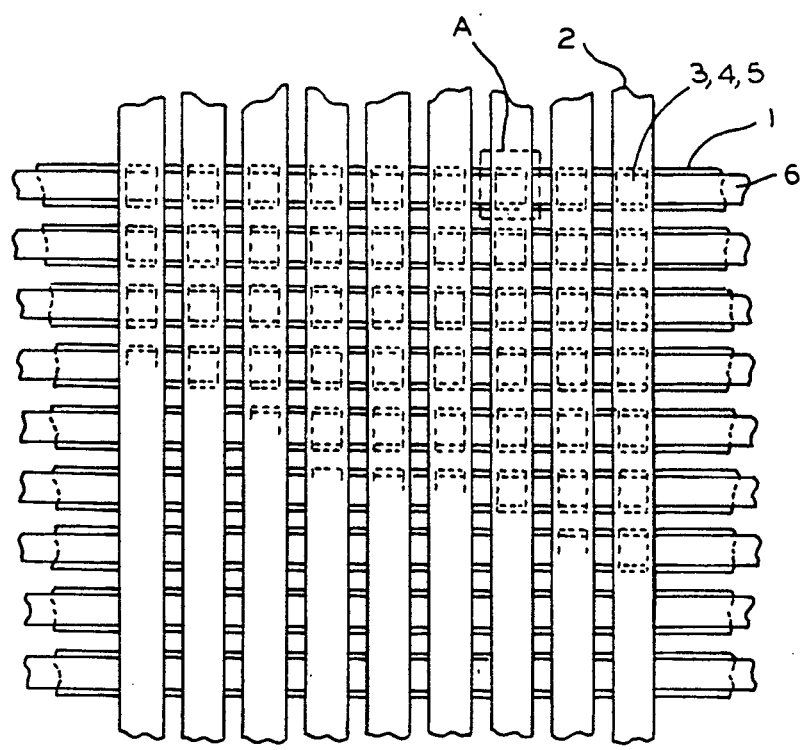
FIG. 5 is a plan view showing an example of basic cells arranged in matrix in the form of a memory.

FIG. 4A shows examples of the magnetization curves 31 and 41 of the magnetic film patterns 3 and 4, respectively. FIG. 5 shows the unit cells of FIG. 1 when they are arranged in matrix. Each portion encompassed by dotted line A represents a unit cell.

As the materials to be used for the memory of the present invention, gold and aluminum are used as the conductor, Pb system, Nb system or Ba-Y-Cu-O system, Bi-Sr-Ca-Cu-O system, Tl-Ba-Ca-Cu-O system ceramics, etc., are used as the superconductor, $SiO_2$ or the like is used as the insulator and silicon is used as the substrate. Known materials such as Ni-Co-Fe alloy and Fe-Ni alloy selected from a wide range can be used for the magnetic film. Known technique can be employed for forming the thin film. Sputtering and laser vapor deposition can be employed for the ceramics described above and dry etching using a chlorine gas is an example of etching.

Figure 6A:
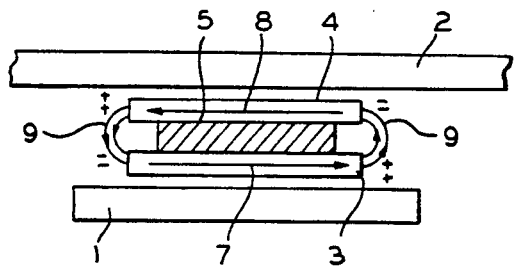
FIGS. 6A and 6B are schematic sectional views of cells showing the state where information is written on the basis of the first embodiment.
Figure 6B:
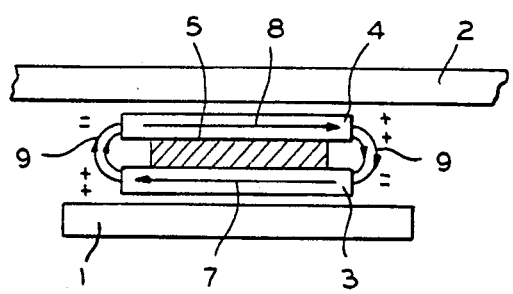

The write operation of information will be explained with reference to FIGS. 2 and 6. The direction of magnetization of the ferromagnetic film pattern 4 with high coercive force is in advance saturated in a predetermined direction as the initial state. The direction in the Y-axis direction represented by reference numeral 8 in FIGS. 2A and 2B is hereby assumed to be a positive direction of the direction of magnetization. The write operation is made in the following way. A pulse current is applied to the superconductor wire 1 extending in the X-axis direction and to the superconductor wire 2 extending in the Y-axis direction so as to reverse the direction of magnetization 8 of the magnetic film pattern 4 at the point of intersection of the superconductor wires 1 and 2 from the Y-axis direction shown in FIG. 2A, that is, the positive direction, to the negative direction. Generally, the direction of magnetization 7 of the ferromagnetic film pattern 3 with low coercive force combines with the magnetization of the magnetic film pattern 4 and is magnetized in the direction opposite to the direction of magnetization of the magnetic film pattern. To attain this state as rapidly as possible, the current to the superconductor wire 2 extending in the Y-axis direction is held longer than the current to the superconductor wire 1 extending in the X-axis direction. Then, the final state is rapidly reached because the magnetization of the magnetic film pattern 3 rotates in the coherent rotation mode by the combination of the magnetic field from the magnetic film pattern 4 with the magnetic field from the superconductor wire in the Y-axis direction. A closed circulated line of magnetic flux 9 is formed between the high coercive force film pattern 4 and the low coercive force film pattern 3. This state is shown in FIGS. 6A and 6B. These drawings correspond to information "1" and "0", respectively. Incidentally, the data write time of one bit when this method is used is in the order of 10 ns.

At the time of over-write, a pulse magnetic field for reset is necessary whose polarity is opposite to the polarity at the time of the write operation prior to the information write operation while the current polarity of the superconductor wire 2 in the Y-axis direction is kept the same as the polarity at the time of the write operation.

Figure 7A:
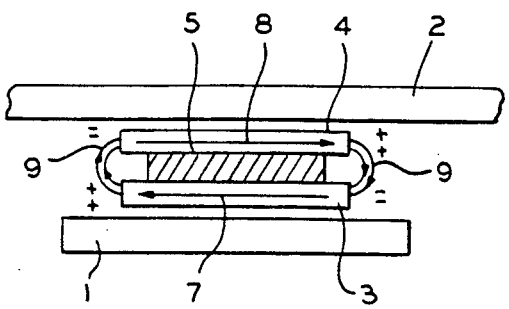
FIGS. 7A and 7B are schematic sectional views of the cell showing the state where stored information is read out on the basis of the first embodiment.
Figure 7B:
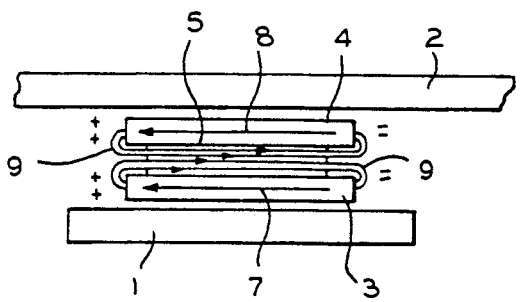

Next, an example of the information read operation of the stored information will be explained with reference to FIGS. 7 and 8. Under the state where the information is written, the magnetization of the magnetic film pattern 4 with high coercive force in the opposite direction to that of the magnetic film pattern 3 with low coercive force. Therefore, almost all of the magnetic fluxes take the circulated route through both magnetic film patterns having low flux resistance as shown in FIG. 7A. As a result, the magnetic flux hardly enters the portion of the superconductor pattern 5.

Under this state a magnetic field for tilting the direction of the magnetization of the magnetic film pattern 3 with low coercive force from the axis of easy magnetization (Y-axis) is applied only to the magnetic film pattern 3 with low coercive force in such a manner that any influences are hardly applied to the magnetization state of the high coercive force magnetic pattern 4 by adjusting the currents applied to the superconductor wires 1 and 2.

Under this state a current magnetic field having a predetermined direction is applied in the Y-axis direction by the superconductor wire 1. Here, the magnetic field by the superconductor wire 1 is applied to the left to the magnetic film pattern 3 with low coercive force. Then, when this memory cell has an information "1" as shown in FIG. 6A, the magnetization of the magnetic film pattern with low coercive force reverses as represented by reference numeral 7 in FIG. 7B and the magnetic flux that has so far circulated between the magnetic film patterns 7 and 8 (FIG. 6A) enters the portion of the superconductor film pattern 5 as represented by reference numeral 9 in FIG. 7B. At this time a bias current is applied to the pattern 5 through the lead wire 6. When a magnetic field larger than $H_{crit}$ is applied to the superconductor film pattern 5 with this change of magnetization, the superconduction state of the microscopic Josephson junctions is broken and electric resistance appears so that a voltage develops across both ends of the lead wire 6.

Figure 8A:
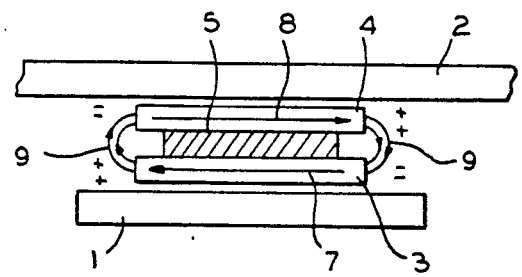
FIGS. 8A and 8B are schematic sectional views of the cell showing the state where read-out is completed on the basis of the first embodiment.
Figure 8B:
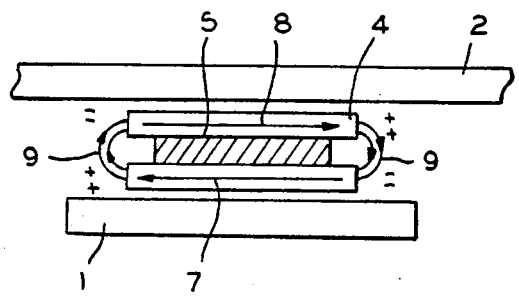

In the case of FIG. 7A, on the other hand, the magnetization state does not change by the application of the magnetic field described above (FIG. 7A) so that the superconduction state of the superconductor film pattern 5 is not broken and the electric resistance does not appear, either. The memory information "1" and "0" are discriminated by utilizing this mechanism. After read-out, the current of the superconductor wire in the X-axis direction is first cut off. Then, the magnetization of the pattern 3 with low coercive force returns rapidly to the original stable state in the coherent rotation mode by the combination of the magnetic field from the high coercive force film pattern 4 and the magnetic field from the superconductor film in the Y-axis direction as shown in FIGS. 8A and 8B. The magnetization of the film pattern 3 with low coercive force is coupled with the magnetization of the magnetic film pattern 4 with high coercive force and is in the stable state. The completely non-destructive read-out operation can thus be made by making contrivance so that no influences are exerted on the magnetization state of the film magnetic pattern 4 with high coercive force by reducing the applied magnetic field at the time of read-out. The transition of the superconduction-normal state occurs only in the cell read out shown in FIG. 7B.

Though this embodiment represents the case where the magnetic film with high coercive force has uniaxial magnetic anisotropy within the plane of film, it is obvious that uniaxial magnetic anisotropy may exist in the magnetic film with low coercive force within the plane of film. However, operation efficiency drops gradually if the magnetic anisotropy of the magnetic film with low coercive force is greater than that of the magnetic film with high coercive force.

Embodiment 2

The appearance of the structure of the unit cell used in this embodiment is the same as the one shown in FIG. 1. Therefore, the description will be made with reference to FIG. 1. The superconductor wire 1 is formed in the same way as in the first embodiment. The differences of this embodiment from the first embodiment are that the pattern 3 shown in FIG. 1 is made of a ferromagnetic film (magnetic anisotropy field $\leq 15$ Oe) having small uniaxial anisotropy within the plane of film and deposited on the superconductor wire 1 through the insulator layer 103 and that the pattern 4 is made of a ferromagnetic film (magnetic anisotropy field $\leq 20$ Oe) having large uniaxial magnetic anisotropy, with the rest of the structure being the same as that of the first embodiment.

In this embodiment the information is written into and stored in the magnetic film pattern 4 with low coercive force having large magnetic anisotropy in the three-layered structure consisting of the ferromagnetic film pattern with low coercive force having large uniaxial magnetic anisotropy, the superconductor film pattern and the ferromagnetic film pattern with low coercive force having small uniaxial magnetic anisotropy. The magnetic film pattern 3 with low coercive force is used for reading out the written information and for stably holding the written information.

Figure 4B:
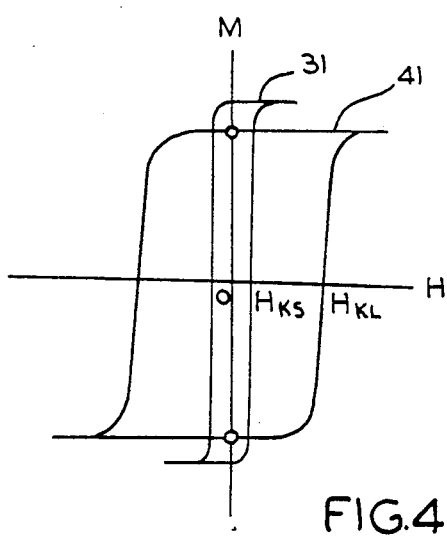
FIG. 4B is a characteristic diagram showing the magnetization curve of the coherent magnetization reversal mode of a ferromagnetic film with low coercive force having large uniaxial magnetic anisotropy $H_{KS}$ and a ferromagnetic film with low coercive force having large uniaxial magnetic anisotropy $H_{KL}$.

FIG. 4B shows examples of the magnetization curves 31, 41 of the magnetic film patterns 3, 4 in the coherent magnetization reversal mode when the magnetic field having the same magnitude is applied in the direction of hard magnetization (X-axis direction) of the ferromagnetic film patterns. The magnetic field applied in the direction of easy magnetization (Y-axis direction) when the coherent magnetization reversal takes place varies depending on the magnitude of uniaxial anisotropy within the plane of film. The present invention utilizes the difference of this reversal magnetic field.

The description of the information read and write operations will be omitted because they are the same as that of the first embodiment.

Though the two magnetic films in this embodiment use the films having low coercive force, it is obvious that they may be the films having high coercive force or their coercive force may be different. If the film having small uniaxial magnetic anisotropy comes to have relatively high coercive force, operation efficiency tends to drop.

Embodiment 3

Figure 9:
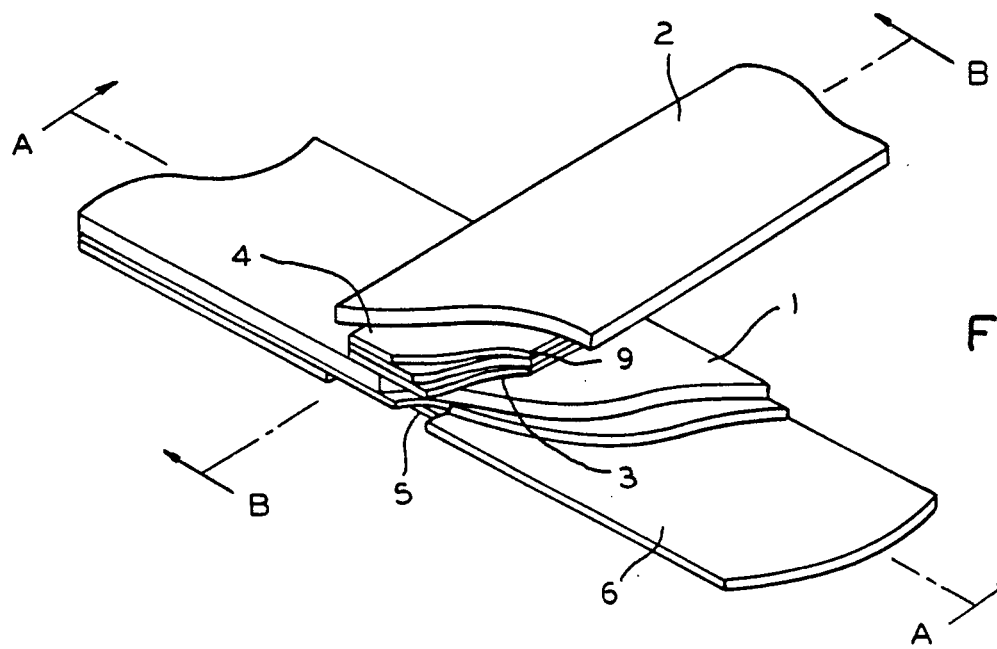
FIG. 9 is a schematic perspective view showing an structural example of the basic cell in accordance with a third embodiment of the present invention.
Figure 10A:
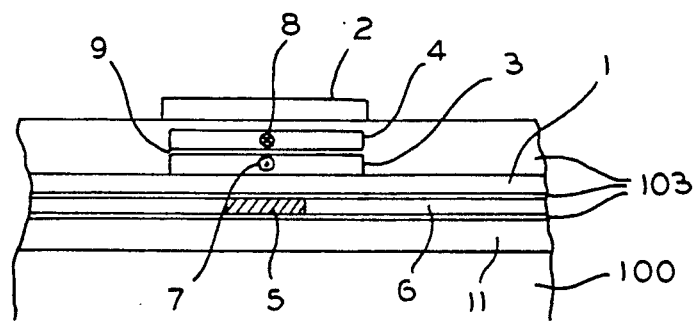
FIG. 10A is a sectional view taken along line A—A of FIG. 9.
Figure 10B:
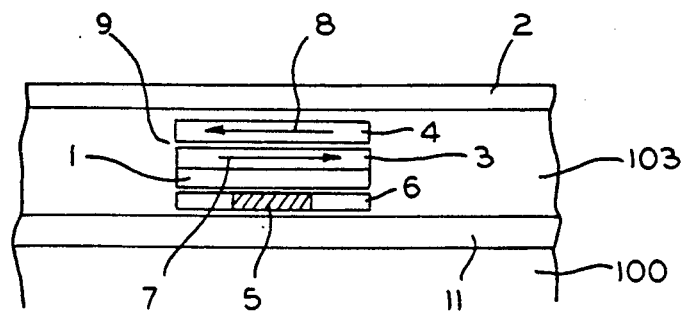
FIG. 10B is a sectional view taken along line B—B of FIG. 9.

Referring to FIGS. 9, 10A and 10B, the superconductor layer 11 is formed on the substrate 100, the superconductor film pattern 5 containing a large number of microscopic Josephson junctions is formed thereon through the insulator layer 103 and the lead wire 6 for applying the current is connected to the superconductor film pattern. The superconductor layer pattern is formed thereon through the insulator layer 103 to form the first superconductor wire 1 extending in the X-axis direction. After the second magnetic film pattern 3 is disposed, the first magnetic film pattern 4 is disposed on the former through the superconductor layer 9. The second superconductor wire 2 is disposed further on the former in such a manner as to cross the superconductor wire 1 at the position of the magnetic film pattern.

This embodiment is characterized in that the operation stability of the memory is improved and its operation time is reduced by use of the structure wherein the superconductor film pattern 5 containing a large number of microscopic Josephson junctions is disposed on one of the sides of the first superconductor wire where the magnetic film pattern 5 does not exist. Furthermore, sensing efficiency, too, can be much more improved than the first embodiment.

In the memory of this embodiment the information is written into and stored in the magnetic film pattern 4 with low coercive force having larger magnetic anisotropy among the ferromagnetic film pattern with low coercive force having great uniaxial magnetic anosotropy inside the plane of film and the ferromagnetic film with low coercive force pattern having small uniaxial magnetic anisitropy. The ferromagnetic film pattern 3 with low coercive force having low magnetic anisotropy is used for the read operation of the written information and for holding it stably. The values of magnetic anisotropy and coercive force of these magnetic film patterns 3 and 4 are not particularly limited to this embodiment but it is only necessary that any of these values are different. The superconductor film pattern 5 used hereby has the structure such that the microscopic Josephson junctions are contained therein and the superconduction state at the junctions is easily broken by the application of the magnetic field and changes to the normal state. FIG. 3 shows the relation between the electric resistance R of the superconductor thin film that can be used for the pattern 5 and the externally applied magnetic field $H_{appl}$. The electric resistance appears when the $H_{appl}$ is larger than the critical magnetic field $H_{crit}$. Though the superconductor pattern 5 is formed by implantation of ions or diffusion of impurity into the ordinary superconductor thin film, there may be the case where these techniques cannot be employed depending on the superconductor material. Therefore, the present invention employs the later-appearing structure.

FIG. 4 shows examples of the magnetization curves of the magnetic film patterns 3 and 4 in the coherent magnetization reversal mode when the magnetic field having the same magnitude is applied in the direction of hard magnetization (X-axis direction) of the ferromagnetic film patterns. The magnetic field applied in the direction of easy magnetization (Y-axis direction) when the coherent magnetization reversal occurs varies depending on the magnitude of uniaxial magnetic anisotropy within the plane of film. This embodiment utilizes the difference of this magnetic field for reversal. Each unit cell shown in FIG. 9 is arranged in matrix in the same way as in FIG. 5.

The materials used for the memory of this embodiment are the same as those of the first embodiment.

Next, the write operation of the information will be explained. The direction of magnetization of the ferromagnetic pattern 4 used for storing the information is in advance saturated in a predetermined direction as the initial state. The direction of magnetization is assumed hereby to be positive in the Y-axis direction represented by reference numeral 8 in FIG. 10A. The write operation is conducted in the following way. The pulse current is applied to each superconductor wire 1 extending in the X-axis direction and superconductor wire 2 extending in the Y-axis direction so that the direction of magnetization 8 of the superconductor film pattern 4 existing at the crossing position between the superconductor wires 1 and 2 in the magnetic pattern 4 at each position changes from the direction of the Y-axis, that is, the positive direction, to the negative direction. This mode is shown in FIG. 10B.

Figure 11A:
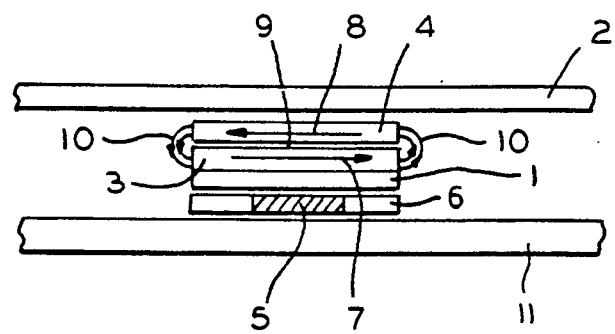
FIGS. 11A and 11B are schematic sectional views of the cell showing the state where information is written on the basis of the third embodiment.
Figure 11B:
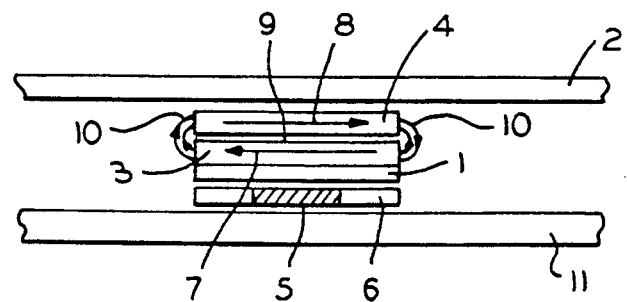

The direction of magnetization 7 of the ferromagnetic film pattern 3 couples with the magnetization of the magnetic film pattern 4 and is magnetized in the opposite direction to that of the magnetization of the magnetic film pattern 4 but in order to attain this state as rapidly as possible, the current applied to the superconductor wire 2 extending in the Y-axis direction is kept for a longer period than the current applied to the superconductor wire 1 extending in the X-axis direction. Then, the magnetization of the magnetic film pattern 3 rotates in the coherent rotation mode due to the combination of the magnetic field from the magnetic film pattern 4 and the magnetic field from the superconductor wire in the Y-axis direction and the state is reached rapidly. The closed circulated line of magnetic induction 10 is for med between the ferromagnetic film pattern 4 and the ferromagnetic film pattern 3. FIGS. 11A and 11B correspond to the state representing the information "1" and "0", respectively. When this method is used, the data write time of one bit is in the order of 10 ns.

At the time of over-write, a pulse magnetic field for reset wherein the polarity of only the current applied to the X-axis direction superconductor wire is reversed to the polarity at the time of the write operation is used while the polarity of the current applied to the Y-axis direction superconductor wire 2 is kept the same, before the information write operation. Alternatively, an external control method is employed so that the magnetic field for reversal having mutually opposite polarities corresponding to the information "1" and "0" are applied to the magnetic film pattern for storing the information.

Next, an example of the read-out method of the written information will be described. Under the state where the information is written, the magnetization of the ferromagnetic film pattern 4 and the magnetization of the ferromagnetic film pattern 3 have mutually opposite directions. Therefore, almost all of the magnetic fluxes take the route circulating both magnetic film patterns having low flux resistance. As a result, the magnetic flux of the superconductor film pattern 5 hardly passes.

Figure 12A:
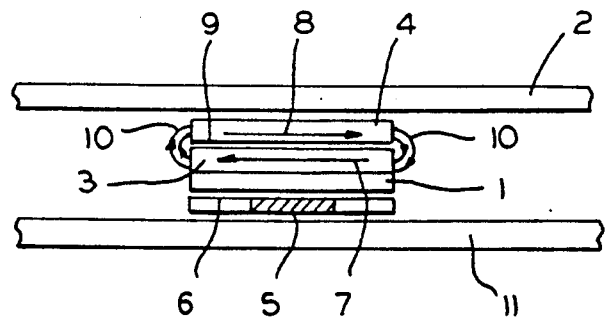
FIGS. 12A and 12B are schematic sectional views showing the state where stored information is being read out on the basis of the third embodiment.
Figure 12B:
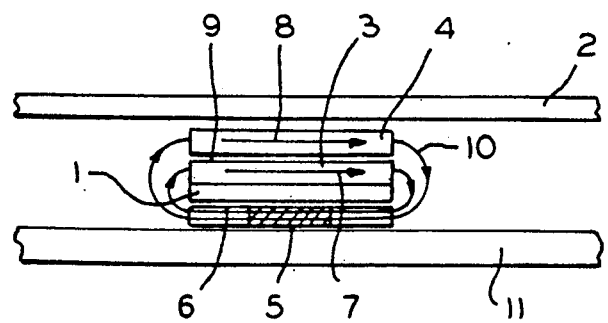
Figure 13A:
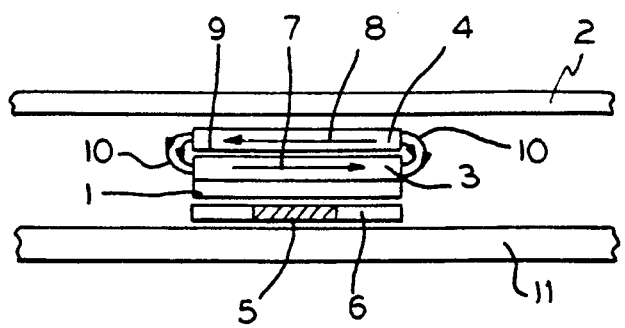
FIGS. 13A and 13B are schematic sectional views of the cell showing the state after the read operation is complete on the basis of the third embodiment.
Figure 13B:
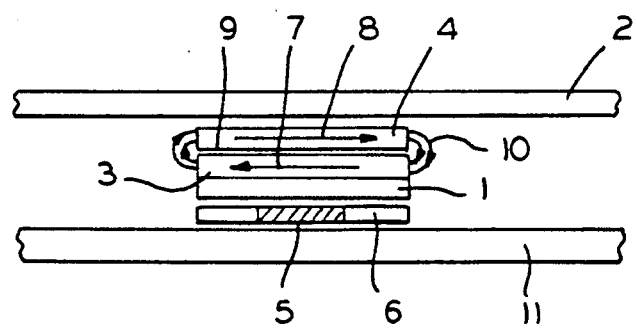

Under this state, the magnetic field tilting the direction of the magnetization from the direction of easy magnetization (Y-axis) is applied to the direction of hard magnetization (X-axis) so that reversal of magnetization due to the coherent rotation mode does not occur in the ferromagnetic film pattern 4 while only the magnetization of the ferromagnetic film pattern 3 can reverse due to the coherent rotation mode. Under this state the current magnetic field having a predetermined direction is applied in the Y-axis direction. Here, the magnetic field by the conductor wire 1 is applied leftward to the ferromagnetic film pattern 3 with low coercive force. Then, the magnetization of the ferromagnetic film pattern 3 reverses as shown in FIG. 12B and the magnetic flux that has circulated between the magnetic film patterns 3 and 4 enters the superconductor film pattern portion 5 as represented by reference numeral 10 in FIG. 12B. At this time the bias current is applied to the pattern 5 by use of the lead wire 6. If a magnetic field larger than the critical magnetic field $H_{crit}$ is applied into the superconductor film pattern 5 due to this change of magnetization, the superconduction state of the microscopic Josephson junctions is broken and the electric resistance appears. Therefore, a voltage develops across both ends of the lead wire 6. On the other hand, in the case of FIG. 12A, the magnetization state does not change due to the application of the magnetic field described above so that the superconduction state of the superconductor film pattern 5 is not broken and the electric resistance does not appear, either. The stored information "1" and "0" are discriminated by use of this mechanism. After the read-out operation, the current of the superconductor wire in the X-axis direction is first cut off. Then, the magnetization of the ferromagnetic film pattern 3 returns rapidly to the original stable state due to the coherent rotation mode by the combination of the magnetic field from the ferromagnetic film pattern 4 and the magnetic field from the superconductor wire in the Y-axis direction.

This read-out operation is characterized in that completely non-destructive read-out of the stored information can be made by reducing the applied magnetic field at the time of read-out so as not to exert any influences on the magnetization state of the ferromagnetic film pattern 4. The transition between the superconduction state-normal conduction state occurs in only the cell as the object of read-out as shown in FIG. 12B.

Next, an example of the formation method of the third superconductor pattern 5 for accomplishing the read-out operation of the stored information will be described. Though there are various methods of forming the microscopic Josephson junctions, all the prior art techniques form the microscopic Josephson junctions by utilizing the film properties determined by the vapor deposition conditions of the film. It has been found out, however, that a desirable structure is not formed by this method depending on the raw materials of the film. This embodiment discloses a method which does not have such dependence on the material elements but can form a desirable structure from the aspect of device. This is the method which utilizes pore formation by surface anodic oxidation of an aluminum film developed for producing a vertical magnetic disk (Noboru Tsuya et al., "Journal of Magnetics Society of Japan" (in Japanese), Vol. 11, No. 2, pp. 55 (1987)).

Figure 14:
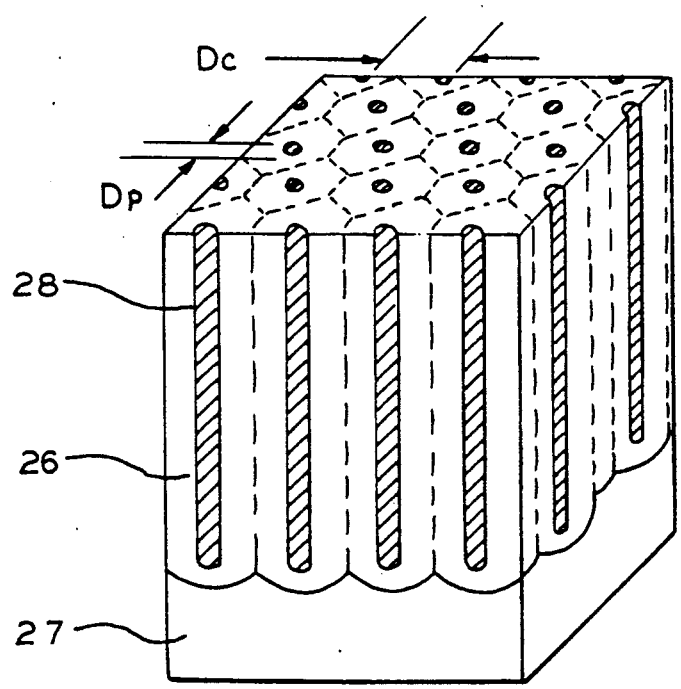
FIG. 14 is a schematic perspective view showing a superconductor structure containing a large number of microscopic Josephson junctions used in the embodiments of the present invention.

The formation steps will be explained definitely with reference to FIGS. 10 and 14. After a superconductor thin film layer 11 serving as a ground plane is formed on a substrate 100, a thin film layer containing 4 wt % MgAl is formed thereon. Since a uniform anodic oxidation film of the MgAl alloy is formed only on a clean substrate surface, alkali etching is conducted in a 5% NaOH aqueous solution at 80° C. for 10 seconds and neutralization is then made in a 5% HNO₃ solution for one minute. The pore formation in the anodic oxidation film is conducted using a carbon plate in 3 wt % oxalic acid or sulfuric acid solution agitated by $N_2$ bubbles as an anode at 20° to 30° C. and at a constant voltage. A cell structure having a hexagonal pillar-like shape of $Al_2O_3$ 26 grows regularly on an anode Al plate 27. This cell reaches a thickness of 2 μm at an electrical quantity of 500 Coulomb/1 dm². Pores having a diameter $D_p$ of several hundreds of Angstroms are formed in individual cells along their center axis. The cell diameter $D_c$ is proportional to the voltage. To further enlarge the pore diameter, a method is employed which treats this anodic oxidation film in a 1% phosphoric acid solution at 30° C. for a predetermined period to dissolve the inner wall of the individual cells. Next, the superconductor 28 is buried in each pore by sputtering. After a layer for eliminating any step is deposited thereon, etch-back is conducted until the surface of the anodic oxidation aluminum film is exposed. When this film structure is shaped as shown in FIG. 14, the $Al_2O_3$ this layer enters the gap between the pillar-like structure superconductors, thereby forming the Josephson junction. Patterning is then made to obtain the third superconductor film pattern 5 and the predetermined lead wire 6 (superconductor wire or conductor wire) is connected. A current is applied in the direction in parallel with the film plane and a magnetic field is applied in parallel with the plane crossing this current direction at right angles. Then, this region causes the transition between the superconduction state and the normal state at the critical magnetic field which is determined depending on the structure. To apply this magnetic field, the pratical memory has the structure wherein the first superconductor film pattern 1, the second magnetic film pattern 3 through the insulator layer 1, the first magnetic film pattern 4 through the superconductor layer 9 and the second superconductor film pattern 2 through the insulator layer are sequentially laminated.

The present invention can accomplish a high-density, high performance memory device which drastically improves instability of the magnetization state after reversal of magnetization and instability of information read-out with the increase in the memory density that have been the problems with the prior art technique.

What is claimed is:

1. A magnetic memory element using superconductor wires comprising:
    a first wire of superconductive material extending in a first direction in parallel with a surface of a substrate;
    a second wire of superconductive material crossing over said first wire and extending in a second direction;
    a first film of magnetic material disposed between said first and second wires at a cross-over position thereof;
    a second film of magnetic material disposed between said first film and second wire at said cross-position;
    a third film disposed between said second film and said substrate. said third film containing a large number of microscopic Josephson junctions;
    lead wires connected to said third film and extending along said first direction;
    first means for changing a magnetized direction of said second film by applying first and second currents to said first and second wires, respectively;
    second means for establishing a magnetized direction of said first film without changing said magnetized direction of said second film by applying a third current to said first wire; and
    a third means for detecting an electric resistance of said third film by applying a fourth current to said lead wires, said electric resistance being caused by a magnetic flux passing through said third film when said first and second films have the same magnetized direction.

2. A magnetic memory element as claimed in the claim 1, wherein said third film is disposed between said first and second films.

3. A magnetic memory element as claimed in the claim 1, wherein said third film is disposed between said first wire and said substrate.

4. A magnetic memory element as claimed in the claim 1, wherein a coercive force of said first film is smaller than a coercive force of said second film.

5. A magnetic memory element as claimed in the claim 1, wherein an uniaxial magnetic anisotropy of said first film is smaller than the uniaxial magnetic anisotropy of said second film.

* * * * *

UNITED STATES PATENT AND TRADEMARK OFFICE
CERTIFICATE OF CORRECTION

PATENT NO. : 5,039,656

DATED : August 13, 1991

INVENTOR(S) : Yasuhara Hidaka

It is certified that error appears in the above-identified patent and that said Letters Patent is hereby corrected as shown below:

Title page, item (73);
  Assignee: NEC Corporation

Signed and Sealed this

Twelfth Day of January, 1993

*Attest:*

DOUGLAS B. COMER

*Attesting Officer*      *Acting Commissioner of Patents and Trademarks*